(12) United States Patent
Thurmaier (10) Patent No.: US 11,163,000 B2
(45) Date of Patent: Nov. 2, 2021

(54) PLATE-SHAPED CONNECTION SYSTEM FOR THE CONNECTION OF TWO TEST UNITS, ALSO CONNECTION UNIT AND TEST SYSTEM EACH WITH SUCH A PLATE-SHAPED CONNECTION SYSTEM

(71) Applicant: Turbodynamics GmbH, Stephanskirchen (DE)

(72) Inventor: Stefan Thurmaier, Bad Aibling (DE)

(73) Assignee: Turbodynamics GmbH, Stephanskirchen (DE)

( * ) Notice: Subject to any disclaimer, the term of this patent is extended or adjusted under 35 U.S.C. 154(b) by 404 days.

(21) Appl. No.: 15/910,111

(22) Filed: Mar. 2, 2018

(65) Prior Publication Data

US 2018/0252767 A1 Sep. 6, 2018

(51) Int. Cl.
*G01R 31/28* (2006.01)
*G01R 1/04* (2006.01)

(52) U.S. Cl.
CPC ....... *G01R 31/2893* (2013.01); *G01R 1/0433* (2013.01); *G01R 31/2887* (2013.01)

(58) Field of Classification Search
CPC .......... G01R 1/02; G01R 1/04; G01R 1/0408; G01R 1/0433–0483; G01R 31/2851; G01R 31/2886–2893
See application file for complete search history.

(56) References Cited

U.S. PATENT DOCUMENTS

| | | | |
|---|---|---|---|
| 6,104,202 A * | 8/2000 | Slocum | G01R 1/04 324/756.03 |
| 6,118,286 A * | 9/2000 | Fredrickson | G01R 1/07307 324/756.02 |
| 6,271,658 B1 * | 8/2001 | Vallinan | G01R 31/2851 324/750.25 |

(Continued)

FOREIGN PATENT DOCUMENTS

| | | | |
|---|---|---|---|
| DE | 10243972 A1 * | 4/2004 | ......... G01R 31/2851 |
| DE | 10243972 A1 | 4/2004 | |
| DE | 10 2012 112 271 A1 | 3/2014 | |

OTHER PUBLICATIONS

Espacenet bibliographic data for DE10243972 published Apr. 8, 2004, two pages.

(Continued)

*Primary Examiner* — Huy Q Phan
*Assistant Examiner* — David B Frederiksen
(74) *Attorney, Agent, or Firm* — Rankin, Hill & Clark LLP; Christopher Jan Korff (57) ABSTRACT

The present invention relates to a plate-shaped connection system for the connection of two test units, such as for example a testing device (tester) and a handling device (handler). The handling device serves for the feeding of semiconductor elements to the tester of a test system, for the testing of such semiconductor elements. The plate-shaped connection system comprises a master frame and an insert frame. The master frame is designed for connection with a first of the two test units and one or more docking elements are provided for releasable connection with the other second test unit. The insert frame is designed that it may be connected to the master frame. The insert frame extends inwards from an inner edge of the master frame, wherein the insert frame has mounting elements for the mounting of a test board.

20 Claims, 5 Drawing Sheets

(56) References Cited

U.S. PATENT DOCUMENTS

| | | | |
|---|---|---|---|
| 6,496,001 B1* | 12/2002 | Barringer | G01R 3/00 324/750.25 |
| 6,844,718 B2 | 1/2005 | Heigl | |
| 6,870,362 B2 | 3/2005 | Thurmaier | |
| 9,134,357 B1 | 9/2015 | Fox et al. | |
| 9,519,023 B2 | 12/2016 | Thurmaier et al. | |
| 9,671,458 B2 | 6/2017 | Thurmaier | |
| 2002/0063566 A1* | 5/2002 | Bruno | G01R 1/07378 324/538 |
| 2005/0073296 A1* | 4/2005 | Mueller | G01R 31/2887 324/750.19 |
| 2007/0096758 A1* | 5/2007 | Kolman | G01R 31/2893 324/750.19 |
| 2009/0102457 A1* | 4/2009 | Vayner | G01R 31/2889 324/756.01 |
| 2010/0134127 A1* | 6/2010 | Breinlinger | G01R 31/2889 324/756.03 |
| 2010/0264949 A1* | 10/2010 | Hobbs | G01R 31/2891 324/750.05 |
| 2014/0046613 A1* | 2/2014 | Roberts, Jr. | G01R 31/2601 702/108 |
| 2015/0033553 A1* | 2/2015 | Wu | G01R 31/2889 29/831 |
| 2015/0123685 A1* | 5/2015 | Thurmaier | G01R 31/2889 324/750.25 |
| 2016/0209443 A1* | 7/2016 | Adams | G01R 31/2879 |

OTHER PUBLICATIONS

German Office action dated Oct. 29, 2020 for DE 10 2017 104 516.3, 5 pages.

\* cited by examiner

PLATE-SHAPED CONNECTION SYSTEM FOR THE CONNECTION OF TWO TEST UNITS, ALSO CONNECTION UNIT AND TEST SYSTEM EACH WITH SUCH A PLATE-SHAPED CONNECTION SYSTEM

The present invention relates to a plate-shaped connection system for the connection of two test units, as for example a testing device (tester) and a handling device (handler) for the feeding of semiconductor elements to the tester of a test system, in order to test such semiconductor elements, also a connection unit for the connection of two such test units by means of such a plate-shaped connection system and a test system with two test units.

DE 102 43 972 A1 discloses a multi-part movable mounting board, with which a testing device (tester) and a handling device (handler) may be connected.

Disclosed in DE 102 16 003 A1 is a docking device. This docking device serves for the releasable connection of a testing device (tester) and a handling device (handler). This docking device facilitates the provision of a precisely aligned connection between the testing device and the handling device. The testing device, of up to 1000 kg in weight, may be held releasably using this docking device.

Known from WO 2013/164407 A1 is a module for the interchange of a roughly flat interface unit or a test board. This module is designed for a test system for the testing of semiconductor elements. This module is provided with a distance setting device, so that the distance between the module and a test unit connected to the module may be varied.

In U.S. Pat. No. 9,134,357 B1 a connection system between a tester 110 and a test head 114 is disclosed. The connection system consists of an outer frame 130 which is connected to the tester 110. This outer frame 130 may receive a stiffening assembly 112, which in turn is connected to a loading board 116 via a stiffening frame 146. The stiffener 112 is detachably connected to the outer frame 130. The stiffening assembly 112 is connected to the test head 114 at the same time.

DE 101 22 049 A1 discloses a device for locking two devices to be coupled together. The system is used, for example, to firmly couple a test head to a test fixture.

DE 10 2012 112 271 A1 discloses an invention via a merging device.

The invention is based on the problem of creating a plate-shaped connection system for the connection of two test units, such as for example a testing device (tester) and a handling device (handler) for the testing of semiconductor elements, so that a multiplicity of different test units may be connected easily and cost-effectively, and different types of semiconductor elements may be tested easily.

A further problem of the present invention lies in the creation of a suitable connection unit for the connection of two test units and the creation of a test system.

A plate-shaped connection system according to the invention for the connection of two test units, such as for example a testing device (tester) and a handling device (handler) for the feeding of semiconductor elements to the tester of a test system for the testing of such semiconductor elements comprises
 a master frame designed for connection with a first of the two test units and having one or more docking elements for releasable connection with the other second test unit, and
 an insert frame which is so designed and connectable with the master frame that the insert frame extends inwards from an inner edge of the master frame, wherein the insert frame has mounting elements for the mounting of a test board.

Since the master frame is designed for connection with one of the two test units and has one or more docking elements for releasable connection with the other second test unit, the main forces occurring between the two test units in the connected state are transmitted via the master frame.

The insert frame is designed to be connectable with the master frame and extends inwards from the inner edge of the master frame, while the insert frame has mounting elements for the mounting of a test board. The test boards, which are also sometimes part of an interface unit, are of differing design for different components to be tested. There are therefore a multiplicity of different test boards, which are used in a test system alternately. It is also possible for different testing devices to be combined with a specific handling device. Another varying feature is the geometry of the test boards, which is adapted to the specific testing device. These varying test boards may be held by correspondingly different insert frames. Since the insert frame, in comparison with the master frame, needs to absorb only relatively minimal forces, it is possible for the insert frame to be made much more cheaply than the master frame. The insert frame needs to have less stiffness than the master frame. It is therefore a simple matter to provide a multiplicity of such insert frames, which may be matched to the varying geometries of the test boards. The master frame may be used for different insert frames.

It is therefore possible with this plate-shaped connection system to test different semiconductor elements in one test system, and also to combine different testing devices with the handling device, while always using the same master frame. It is only necessary to change the test board. In some cases it is also necessary to change the insert frame.

In this way a simple, cost-effective and flexible solution for the connection of a tester and a handler is created, so that the test system connected by the plate-shaped connection system may be adjusted easily and very flexibly for the testing of different semiconductor elements.

The mounting elements of the insert frame for the mounting of a test board may be through holes, threaded holes, strips in which the test boards are held positively, clips and/or other means of mounting for mounting a test board on the insert frame.

These semiconductor elements are typically semiconductor components (ICs) or wafers.

Preferably the master frame is provided with a distance setting device, which may be used to set the distance between the master frame and one of the two test units. This distance setting device may have one or more threaded shanks, each reaching through a wheel with internal thread mounted rotatably on the master frame. These wheels are designed to be rotatable together by means of a drive belt for adjusting the distance.

The threaded shanks are designed in each case to be attachable by one end to one of the two test units, in particular to the first test unit so that, through actuation of the distance setting device, the distance between this test unit and the master frame may be adjusted. The threaded shanks may be attached directly to the respective test unit, or also indirectly, for example by means of an index plate, explained in detail below.

The insert frame may be so designed that it may be fitted and attached to the master frame in different rotary positions. In this way, using the same insert frame, a test board may be fixed between the two test units in different rotary positions.

The master frame is preferably made from a metal plate. This metal plate may be an aluminium plate. The thickness of the master frame is preferably at least 10 mm and in particular at least 15 mm.

The docking elements conform preferably to the docking elements known from DE 102 16 003 A1. The corresponding mating docking elements are preferably provided on the second test unit. Reference is therefore made to DE 102 16 003 A1 in full.

It is possible to provide an index plate which may be fitted between the first test unit and the master frame. The index plate has test unit connecting elements for connection to the test unit, and master frame connecting elements for connection to the master frame. The master frame connecting elements are arranged radially outside the test unit connecting elements. The test unit connecting elements and the master frame connecting elements may be holes, threaded holes, dowel pins, bolts or the like. The test units, in particular the handling devices, have corresponding mating connection elements in a specific grid pattern. It may be expedient to make the master frame so large that it cannot be made to coincide with this grid. With the index plate, therefore, the mating connection elements provided on the test unit are transferred radially outwards by the master frame connecting elements formed on the index plate, so that a suitably large master frame may be attached. This is expedient in particular if the master frame has a distance setting device since then, depending on the set distance between the master frame and the first test unit, components of the distance setting device, such as e.g. threaded shanks, may protrude a short distance from the master frame towards the second test unit. These components are then preferably arranged radially outside the second test unit, so that they do not collide with the latter. This is made possible by a suitably large master frame.

According to a further aspect of the present invention, a connection unit for the connection of two test units, such as for example a testing device (tester) and a handling device (handler) for feeding the semiconductor elements to the tester of a test system for testing such semiconductor elements, is provided. This connection unit comprises a plate-shaped connection system, as described above, and a test board which is fixed to the insert frame.

The test board may have a stiffener.

The test board may be provided with one or more sockets. According to a further aspect of the present invention a test system with two test units is provided, such as for example a testing device (tester) and a handling device (handler) for feeding semiconductor elements to the tester for testing semiconductor elements, comprising a plate-shaped connection system, as described above, or a connection unit as described above.

The test system may be a vertical or a horizontal test system. In a vertical test system the plate-shaped connection system is arranged parallel to a vertical plane, and in a horizontal test system the plate-shaped connection system is arranged parallel to a horizontal plane.

The invention is explained by way of example below with the aid of the appended drawings which show in:

FIG. 1 a test system with a plate-shaped connection system in a schematic, perspective exploded view FIG. 2 a master frame of the test system of FIG. 1 in an overhead view FIGS. 3a, 3b the master frame of FIG. 2 together with its insert frame and an interface unit, wherein the interface unit is exposed to two different directions FIGS. 4-7 in each case the master frame of FIG. 2 with an insert frame and different interface units, viewed from above A test system 1 comprises a testing device 2, also described as a tester, and a handling device 3, which is also described as a handler (FIG. 1). The test system is designed for the testing of semiconductor elements. The semiconductor elements may be semiconductor components (ICs) or wafers. The testing device 2 contains the test electronics and electrical contacts for contacting the semiconductor elements. The handling device is used for handling the semiconductor elements which are fed to the testing device 2 in succession and tested by it. The test system 1 may be so designed that, at a specific point in time, in each case only one semiconductor element is tested. It may however also be so designed that several semiconductor elements can be tested simultaneously. Currently it is usual for up to 16 semiconductor elements to be tested simultaneously.

Figure 1:
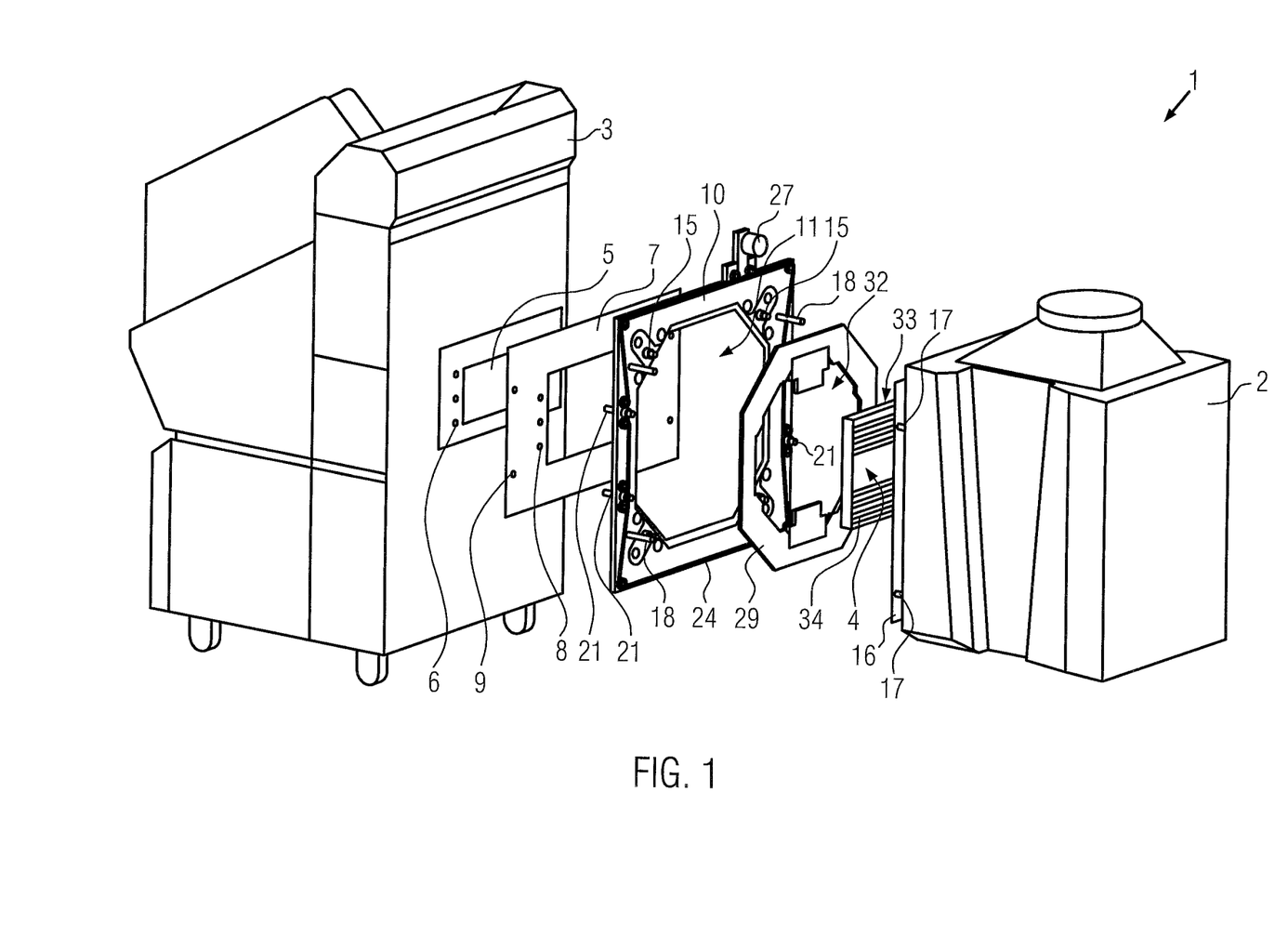

So that different semiconductor elements may be tested by the system 1, a test board 4 is provided which on one side is in contact with the contact elements of the testing device 2, and on the other side has contact elements for contacting the semiconductor elements to be tested. The test board 4 thus converts the pattern of the contact elements of the testing device 2 into the pattern of the contact elements of the semiconductor elements to be tested. The test board 4 thus forms an adapter by which the contact elements of the testing device 2 are converted into the pattern of the contact elements of the respective semiconductor elements. For each type of semiconductor element to be tested by the test system 1, a separate test board 4 is provided. If the type of semiconductor elements to be tested by the test system 1 is changed, then the test boards are replaced and a test board suitable for the new type of semiconductor elements in inserted in the test system 1. The test boards 4 generally have spring contact pins for contacting the semiconductor elements. These test boards are essentially known and need not therefore be explained further.

The testing devices 2 and the handling devices 3 are as a rule made by different manufacturers. The testing devices 2 generally determine the shape and size of the test boards 4. The testing devices 2 and the handling devices 3 must be connected to one another very precisely, so that the semiconductor elements to be tested can be contacted reliably. Known for this purpose are docking devices, as disclosed for example in DE 102 16 003 A1 outlined above, by which the testing devices 2 and the handling devices 3 may be releasably connected to one another. After release and reconnection, the position of the testing device 2 relative to the handling device 3 may differ by no more than a few tenths of millimetres. In this connection it should be noted that the testing device and the handling device, which each form a test unit of the test system 1, may weight a tonne or more, while as a rule one of the two test units is suspended freely from the other test unit. This weight must be held reliably by the docking device.

In order to make possible the connection of a wide variety of testing devices 2 with handling devices 3 for the testing of a wide variety of semiconductor elements, the plate-shaped connection system shown in FIG. 1 has been developed, and is described in detail below:

The handling device 3 has an opening 5, to which the semiconductor elements to be tested are conveyed in succession. Around the opening 5, threaded holes 6 are arranged in a predetermined grid.

An index plate 7 is provided, which roughly in its centre has a through hole which is at least the size of the opening 5 of the handling device 3. The index plate has holes 8 arranged in the same grid as the threaded hole 6 of the handling device 3, so that the index plate 7 may be secured to the handling device 3 by means of bolts. Here the index plate 7 is so arranged with its opening that the opening 5 of the handling device 3 is freely accessible. The holes 8 are also subsequently described as test unit connection elements 8.

The index plate 7 has threaded holes 9 which are arranged radially outside relative to the test unit connection elements 8. These threaded holes 9 are subsequently also described as master frame connection elements 9.

With these master frame connection elements 9, a master frame 10 may be fixed to the handling device 3, even when the master frame 10 is so large that it cannot be brought to coincide with the threaded holes 6 of the handling device 3. The master frame 10 is made of a rigid metal plate, in particular aluminium plate. It has a thickness of at least 10 mm. In the present embodiment the thickness is 15 mm.

Figure 2:
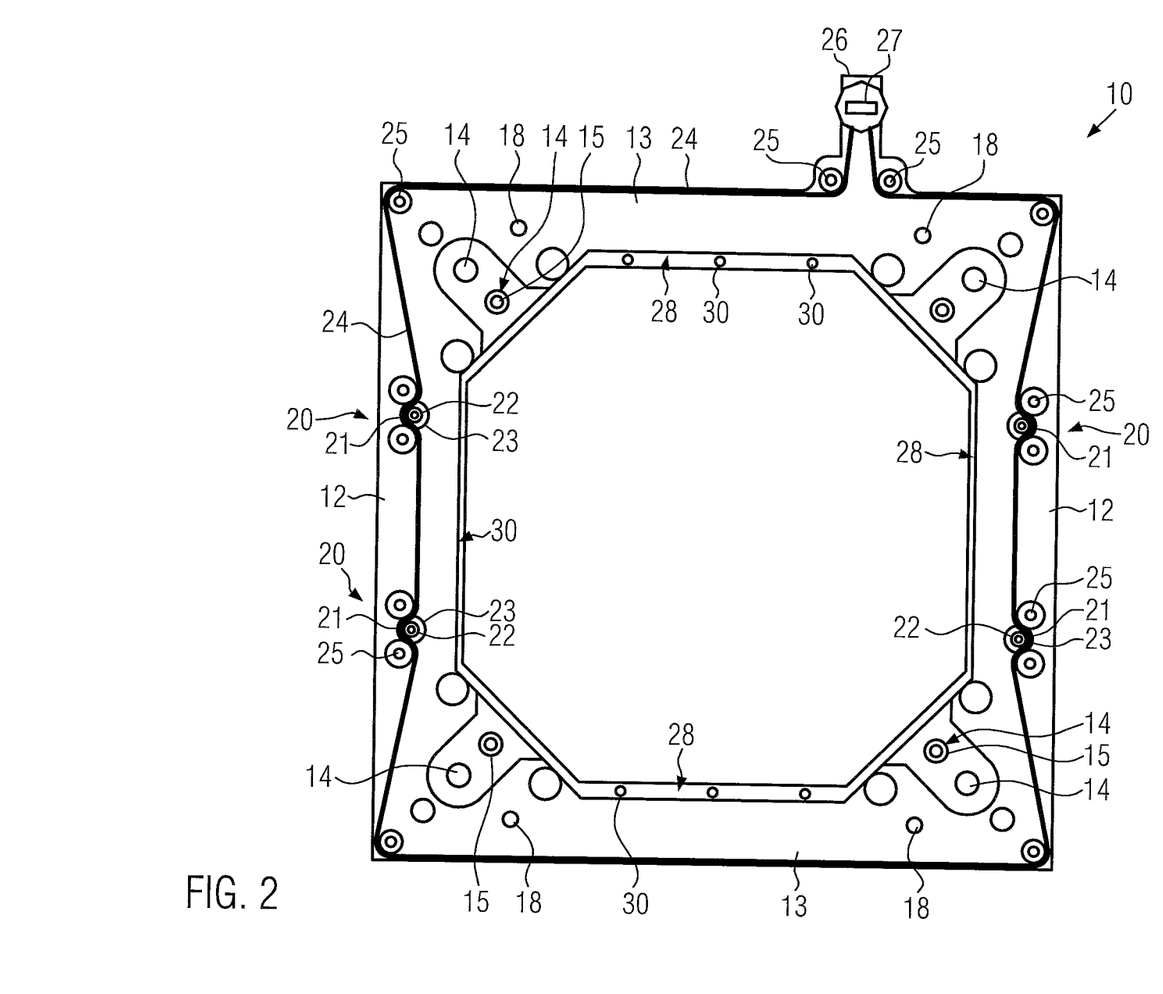

Viewed from above, the master frame 10 has a roughly square outer contour, and an octagonal through hole 11 concentric to it (FIG. 2). The master frame 10 thus has a right-hand and a left-hand vertical strut 12 and an upper and a lower horizontal strut 13. The struts 12, 13, viewed from above, are substantially strip-shaped, while however widening inwards at their end sections, so that the master frame 10, viewed from above, has a greater width in the area of its corners. The corners of the through hole 11 are thus drawn a short distance inwards, forming in each case an inner edge, which is arranged at an angle of 45° to the adjacent inner edges of the struts 12, 13. In this area of the master frame 10, drawn inwards relative to the through hole 11, docking element holders 14, each for holding a docking element 15, are provided. The docking element holders 14 have a specific pattern of threaded holes, so that each docking element 15 may be fastened to the master frame 10 by means of bolts, in the area of the docking element holders 14.

Corresponding mating docking elements (not shown) are fastened to the testing device 2, so that the testing device 2 may be connected releasably to the docking elements 15 of the master frame 10, and this device 2 may also be fastened to the handling device 3. The mating docking elements of the testing device 2 may be fastened directly to the latter, or also indirectly by means of a suitable index plate 16, which has the same function as the index plate 7 described above, namely to shift the grid of threaded holes of the testing device 2 radially outwards. In the present embodiment, the testing device 2 has such an index plate 16, which protrudes a short distance from the side vertical edges of the testing device 2. Formed in these protruding edges are dowel holes 17. The master frame 10 has corresponding dowel pins 18 which protrude vertically for a short distance from the side of the master frame 10 facing the testing device 2, and are flush with the dowel holes 17 of the index plate 16 of the testing device 2.

The master frame 10 has a distance setting device 19. This distance setting device 19 comprises four distance setting elements 20 (FIG. 2). Each distance setting element 20 has a threaded flange 21. The threaded flange 21 is tubular and has an external thread on its peripheral surface. With the external thread, each threaded flange 21 is screwed into a gear 22. Each gear 22 has a central through hole with an internal thread. The external thread of the threaded flange 21 engages with this internal thread. Each gear 22 is mounted on a bearing disc 23. The bearing disc 23 is mounted rotatably by means of an axial and radial bearing (not shown). The gears 22 are thus mounted rotatably on the master frame 10. By turning the gears 22, the threaded flanges 21 may be moved axially relative to the master frame 10, if they are not fixed rotatably.

The four distance setting elements 20 are distributed in the edge area of the master frame 10, in particular in the area of the two vertical struts 12. The threaded flanges 21 are connected non-rotatably by one end to one each of the master frame connection elements 9 of the index plate 7 of the handling device 3. The threaded flanges 21 are rigid, thick, tubular rods, able to transmit high forces and so absorb the load of the testing device 2.

A drive belt 24 is guided by guide pulleys 25 along the edge area of the master frame 10. In the present embodiment the drive belt is a toothed belt which, with its teeth, meshes with all of the gears 22. Fastened to the upper horizontal strut 13 is an upwards projecting strip 26. Provided on the strip 26 is a hand-operated adjusting wheel 27, which is connected to a further gear (not shown). This gear too engages with the drive belt 24, so that the drive belt 24 may be moved by turning the adjusting wheel 27. The rotation of the adjusting wheel 27 is thus transferred to all gears 22. By simultaneous turning of all gears 22, the threaded flanges 21 are moved relative to the master frame 10, so that the distance of the master frame 10 from the handling device 3 is varied. Provided on the adjusting wheel 27 is a digital scale, by which the revolutions of the adjusting wheel 27 may be counted.

The distance setting device 19 may thus be used to set the distance between the master frame 10 and the handling device 3, and the distance between the testing device 2 and the handling device 3, respectively.

Viewed from above, the threaded flanges 21 are arranged on the master frame 10 in an area outside the testing device 2 or outside the index plate 16 of the testing device 2, so that neither the testing device 2 nor the index plate 16 collide with one of the threaded flanges 21 when the testing device 2 is moved towards the handling device 3 by means of the distance setting device 19. In this connection, the threaded flanges 21 may protrude from the master frame 10 a short distance towards the testing device 2.

Provided on the testing device 2 on the side facing the handling device 3 is a pin (not shown), which engages with one of the gears 22 or one of the guide pulleys 25, when the testing device 2 is fastened to the master frame 10 by means of the docking elements 15. By this means the distance setting device 19 is blocked, when the testing device 2 is connected to the master frame 10. This pin thus forms a blocking device for blocking the distance setting device 19 when the two test units are connected to one another by means of the plate-shaped connection system.

Formed on the inner edge of the master frame 10, on the side facing towards the testing device 2, is a continuous step 28 for accommodating an insert frame 29. The insert frame 29 is made with its external contour complementary to this step 28, so that it is held by it positively with slight play. In the area of the step, threaded holes 30 are made in the master frame 10, and corresponding holes 31 in the insert frame 29, so that the insert frame 29 may be fixed to the master frame 10 by bolts.

The step 28 and the external contour of the insert frame 29, and the arrangement of the threaded hole 30 and of the hole 31 are preferably rotation-symmetrical with reference to a rotation angle of 90°, so that the insert frame 29 may be arranged and fixed to the master frame 10 in different rotary positions.

As compared with the master frame 10, the insert frame 29 must absorb only minimal loads, and may therefore be made of a thin metal plate or of a plastic plate. The insert frame 29 has a through hole 32, which is bounded by an inner edge of the insert frame 29.

The inner edge of the insert frame 29 is so shaped, and provided with connection elements, that the test board 4 and an interface unit 33 may be fastened to it. Since there is a wide variety of test boards 4 and interface units 33, separate insert frames 29 are provided for different test boards 4 and different interface units 33.

An interface unit 33 includes such a test board 4 and a stiffener 34 connected to the test board 4 and generally made of an aluminum frame or aluminum grid. The interface unit may also include one or more sockets 35, which are located on the test board 4 on the side facing the testing device 2. The sockets 35 serve for contacting the contact elements of the testing device 2. Each socket 35 is assigned a test field of contact elements of the test board 4 on the side facing the handling device 3, with which in each case a semiconductor element may be contacted. The number of sockets 35 therefore corresponds to the number of semiconductor elements which may be tested simultaneously.

Figure 7:
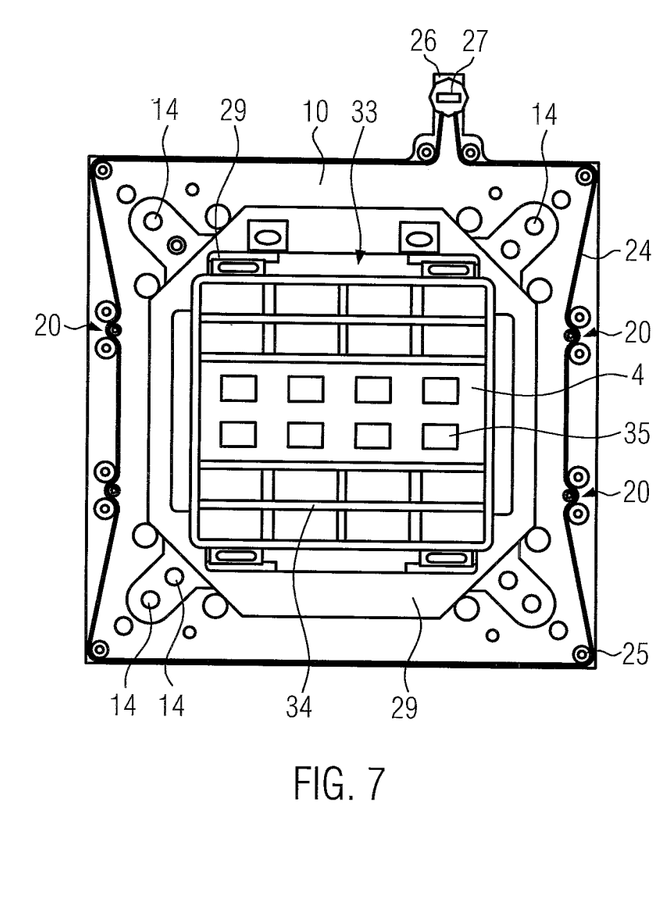

FIGS. 3, 4, 5, 6, 7 show in each case the master frame 10 with different interface units 33, each fastened to the master frame 10 by an insert frame 29. The master frame 10 is in each case the same. In each of the embodiments according to FIGS. 3, 4, 5 and 6, the same insert frame 29 is provided. FIG. 7 shows a different insert frame with an inner edge which has a contour differing clearly from the other insert frames. The external contour of all insert frames 29 is on the other hand identical and fits into the corresponding contour of the master frame 10.

Figure 3A:
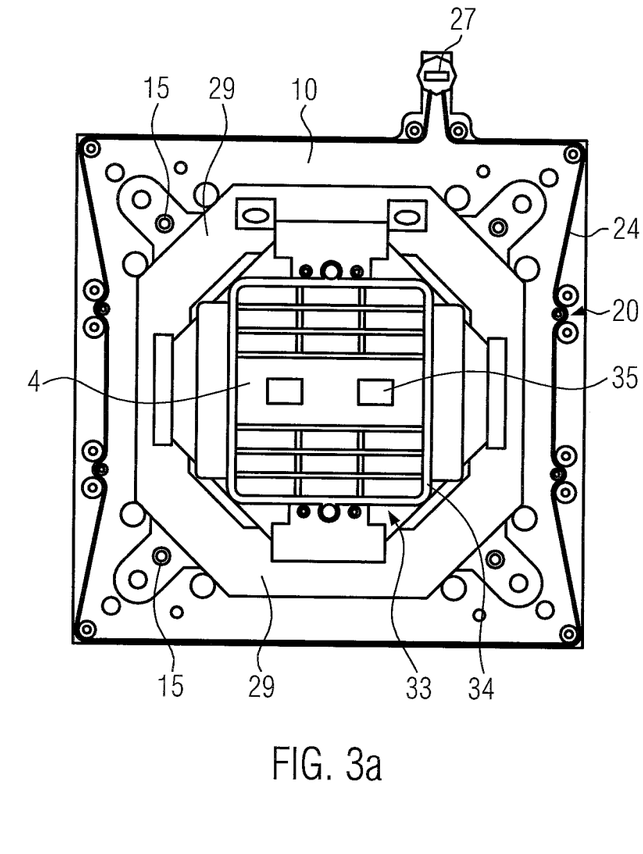
Figure 3B:
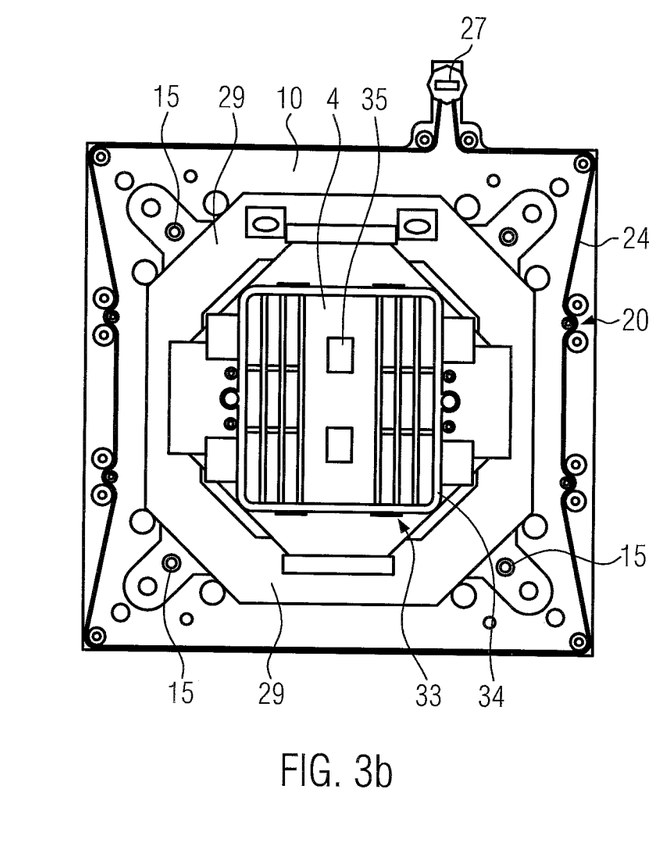
Figure 4:
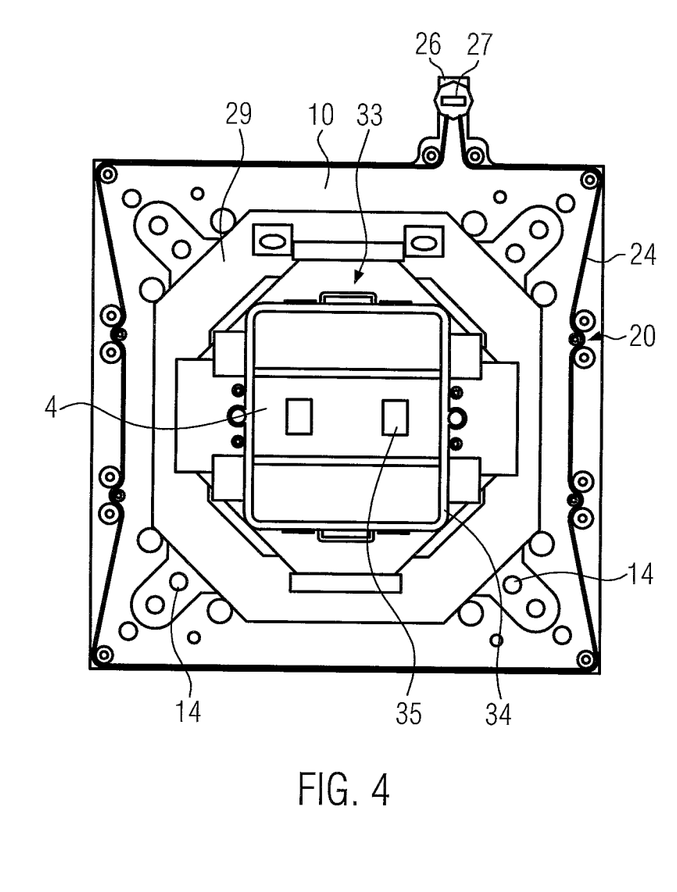
Figure 5:
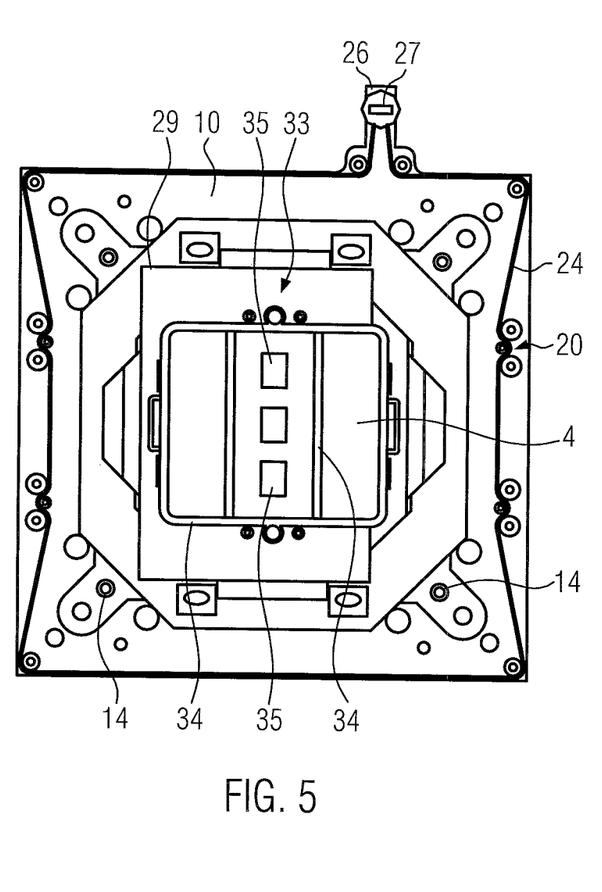
Figure 6:
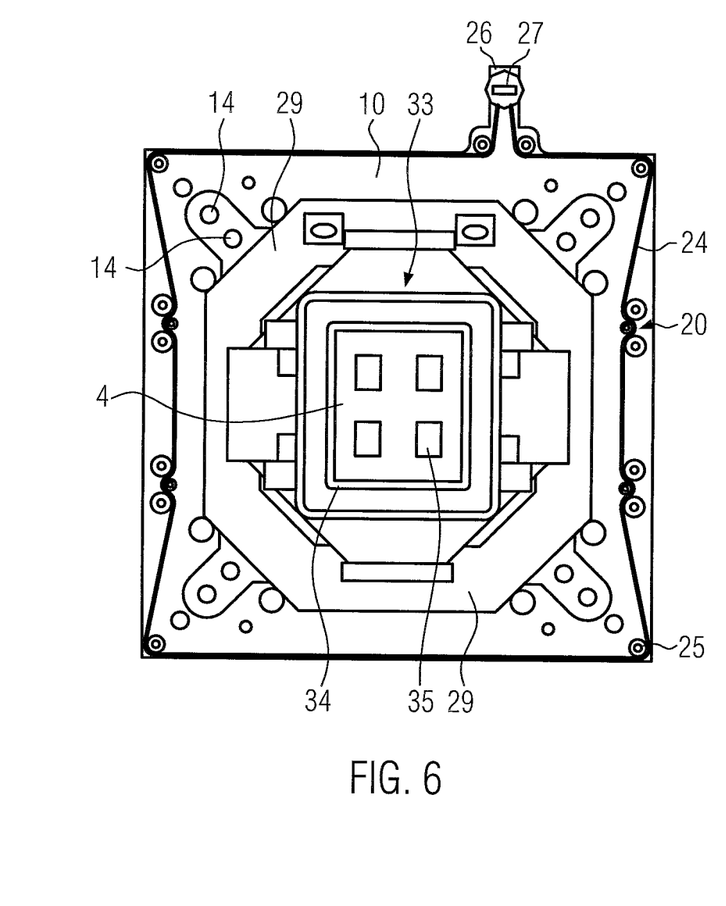

FIGS. 3a and 3b show the same interface unit 33, but in two rotary positions rotated through 90°.

In the embodiment shown in FIGS. 3a and 3b, the interface units 33 are mounted in the insert frame 29 in positions rotated through 90°. In principle it is also possible to mount the insert frame 29 on the master frame 10 in positions rotated through 90°. The different rotary positions may therefore be brought about through the connection between the master frame 10 and the insert frame 29 or by different connections between the insert frame 29 and the interface unit 33 and test board 4.

As shown above with the aid of the examples, an insert frame 29 may be designed and suitable for holding different test boards 4 and different interface units 33. There is however such a multiplicity of different test boards 4 and interface units 33 that in practice it is impossible to fasten all test boards 4 and all interface units 33 to the master frame 10 with a single insert frame 29.

The master frame 10 transfers the mechanical main load between the testing device 2 and the handling device 3, and also has the distance setting device 19. The master frame 10 is therefore significantly more stable and mechanically more complex than the insert frame 29. The master frame 10 can be used in all combinations of testing devices 2 and handling devices 3 and test boards 4. Adaptation to the various test boards 4 is effected solely by changing the relevant insert frame 29, which is very much simpler and more cost-effective. This test system therefore permits high flexibility with regard to the combination of different testing devices and different handling devices with any desired test boards, in order to facilitate the testing of a wide variety of semiconductor elements. The distance setting allows simple adaptation to interface units 33 of different thickness. In total, through the invention, a technically simple and with it cost-effective solution for the connection of any desired testing devices and handling devices is obtained, wherein any desired test boards and interface units may be used.

The master frame 10 may have several docking element holders 14, so that the docking elements 15 may be fixed at different positions on the master frame 10, allowing test units (testing device, handling device) of different size to be connected to them.

In the embodiment described above, a distance setting device is provided. The master frame 10 may however also be made without a distance setting device. It may then be fastened for example by means of bolts to the index plate 7 or directly to the relevant test unit. For this purpose it may be expedient to provide differing hole patterns on the master frame 10, which are compatible with the grid of the threaded holes of different test units.

In the embodiment described above, the master frame 10 is fixed to the handling device 3 and the testing device 2 is connected to the master frame 10 by means of docking elements 15. Within the scope of the invention it is of course also possible for the master frame to be connected to the handling device 3 by means of docking elements and for the master frame to be fixed to the testing device 2 by means of the distance setting device 19 or by means of bolts or the like.

The test system 1 shown in FIG. 1 is a vertical test system, i.e. the plate-shaped connection system, comprising the master frame 10 and the insert frame 29, is arranged parallel to a vertical plane. The invention may of course also be used with a horizontal test system 1, in which the plate-shaped connection system is arranged parallel to a horizontal plane.

The invention is further defined by the following items.

1. Plate-shaped connection system according to the invention for the connection of two test units, such as for example a testing device (tester) and a handling device (handler) for the feeding of semiconductor elements to the tester of a test system for the testing of such semiconductor elements comprises
   a master frame designed for connection with a first of the two test units and having one or more docking elements for releasable connection with the other second test unit,
      wherein one of the test units can be fastened freely hanging on the other test unit, and
      an insert frame which is so designed and connectable with the master frame that the insert frame extends inwards from an inner edge of the master frame, wherein the insert frame has mounting elements for the mounting of a test board.
2. Plate-shaped connection system according to item 1, wherein the master frame is provided with a distance setting device, which may be used to set the distance between the master frame and one of the two test units.
3. Plate-shaped connection system according to item 2, wherein the distance setting device may have one or more threaded shanks, each reaching through a wheel with internal thread mounted rotatably on the master frame, wherein these wheels are rotatable together by means of a drive belt for adjusting the distance.
4. Plate-shaped connection system according to item 3, wherein the threaded shanks are attachable in each case by one end to one of the two test units, in particular to the first test unit so that, through actuation of the distance setting device, the distance between this test unit and the master frame may be adjusted.
5. Plate-shaped connection system according to any of items 1 to 4 wherein the insert frame may be fitted to the master frame in different rotary positions.

6. Plate-shaped connection system according to any of items 1 to 5,
wherein the master frame is made from a metal plate, in particular an aluminium plate, with a thickness of at least 10 mm.
7. Plate-shaped connection system according to any of items 1 to 6,
wherein an index plate is provided, which may be fitted between the first test unit and the master frame, wherein the index plate has test unit connecting elements for connection to the test unit, and master frame connecting elements for connection to the master frame, wherein the master frame connecting elements are arranged radially outside the test unit connecting elements.
8. Connection unit for the connection of two test units, such as for example a testing device (tester) and a handling device (handler) for feeding the semiconductor elements to the tester of a test system for testing such semiconductor elements, comprising
a plate-shaped connection system according to the invention for the connection of two test units, such as for example a testing device (tester) and a handling device (handler) for the feeding of semiconductor elements to the tester of a test system for the testing of such semiconductor elements comprises
a master frame designed for connection with a first of the two test units and having one or more docking elements for releasable connection with the other second test unit,
wherein the first of the two test units is kept by the master frame connected to the second test unit, and
an insert frame which is so designed and connectable with the master frame that the insert frame extends inwards from an inner edge of the master frame, wherein the insert frame has mounting elements for the mounting of a test board, and
a test board which is fixed to the insert frame.
9. Connection unit according to item 8,
wherein the test board has a stiffener and/or the test board is provided with one or more sockets.
10. Test system with two test units, such as for example a testing device (tester) and a handling device (handler) for feeding the semiconductor elements to the tester of a test system for testing such semiconductor elements, comprising
a plate-shaped connection system according to the invention for the connection of two test units, such as for example a testing device (tester) and a handling device (handler) for the feeding of semiconductor elements to the tester of a test system for the testing of such semiconductor elements comprises
a master frame designed for connection with a first of the two test units and having one or more docking elements for releasable connection with the other second test unit,
wherein the first of the two test units is kept by the master frame connected to the second test unit, and
an insert frame which is so designed and connectable with the master frame that the insert frame extends inwards from an inner edge of the master frame, wherein the insert frame has mounting elements for the mounting of a test board, and
a connection unit for the connection of two test units, such as for example a testing device (tester) and a handling device (handler) for feeding the semiconductor elements to the tester of a test system for testing such semiconductor elements, comprising
a plate-shaped connection system according to the invention for the connection of two test units, such as for example a testing device (tester) and a handling device (handler) for the feeding of semiconductor elements to the tester of a test system for the testing of such semiconductor elements, and
a test board which is fixed to the insert frame.
11. Test system according to item 10,
wherein the test system is a vertical or a horizontal test system.

LIST OF REFERENCE NUMBERS 1 test system
2 testing device (tester)
3 handling device (handler)
4 test board
5 opening
6 threaded hole
7 index plate
8 hole
9 threaded hole
10 master frame
11 through hole
12 vertical strut
13 horizontal strut
14 docking element holder
15 docking element
16 index plate
17 dowel hole
18 dowel pin
19 distance setting device
20 distance setting element
21 threaded flange
22 gear
23 bearing disc
24 drive belt
25 guide pulley
26 strip
27 adjusting wheel
28 step
29 insert frame
30 threaded hole
31 hole
32 through hole
33 interface unit
35 stiffener
36 socket

The invention claimed is:
1. A plate-shaped connection system for connecting two test units, a tester and a handler, for feeding semiconductor elements to the tester for testing of said semiconductor elements, the plate-shaped connection system comprising:
a master frame designed for connection with a first of the two test units and having one or more docking elements for a releasable connection with the other second test unit, wherein one of the test units can be fastened freely hanging on the other test unit, and
an insert frame designed to be connectable with the master frame wherein the insert frame extends inward from an inner edge of the master frame, wherein the insert frame has mounting elements for the mounting of an interface unit comprising a test board and a stiffener.

2. The plate-shaped connection system according to claim 1, wherein the master frame is provided with a distance setting device, which may be used to set the distance between the master frame and one of the two test units.

3. The plate-shaped connection system according to claim 2,
wherein the distance setting device has at least one threaded shank, said at least one threaded shank each reaching through a wheel with internal thread mounted rotatably on the master frame,
wherein these wheels are rotatable together by a drive belt for adjusting the distance.

4. The plate-shaped connection system according to claim 3, wherein the threaded shanks are attachable in each case by one end to one of the two test units, so that, through actuation of the distance setting device, the distance between this test unit and the master frame may be adjusted.

5. The plate-shaped connection system according to claim 1, wherein the insert frame may be fitted to the master frame in different rotary positions.

6. The plate-shaped connection system according to claim 4, wherein the insert frame may be fitted to the master frame in different rotary positions.

7. The plate-shaped connection system according to claim 1, wherein the master frame is made from an aluminum plate, with a thickness of at least 10 mm.

8. The plate-shaped connection system according to claim 4, wherein the master frame is made from an aluminum plate, with a thickness of at least 10 mm.

9. The plate-shaped connection system according to claim 1,
wherein an index plate is provided, which is designed to be fitted between the first test unit and the master frame,
wherein the index plate has test unit connecting elements for connection to the test unit, and master frame connecting elements for connection to the master frame,
wherein the master frame connecting elements are arranged radially outside the test unit connecting elements.

10. The plate-shaped connection system according to claim 2,
wherein an index plate is provided, which is designed to be fitted between the first test unit and the master frame,
wherein the index plate has test unit connecting elements for connection to the test unit, and master frame connecting elements for connection to the master frame,
wherein the master frame connecting elements are arranged radially outside the test unit connecting elements.

11. The plate-shaped connection system according to claim 3,
wherein an index plate is provided, which is designed to be fitted between the first test unit and the master frame,
wherein the index plate has test unit connecting elements for connection to the test unit, and master frame connecting elements for connection to the master frame,
wherein the master frame connecting elements are arranged radially outside the test unit connecting elements.

12. The plate-shaped connection system according to claim 4,
wherein an index plate is provided, which is designed to be fitted between the first test unit and the master frame,
wherein the index plate has test unit connecting elements for connection to the test unit, and master frame connecting elements for connection to the master frame,
wherein the master frame connecting elements are arranged radially outside the test unit connecting elements.

13. The plate-shaped connection system according to claim 5,
wherein an index plate is provided, which is designed to be fitted between the first test unit and the master frame,
wherein the index plate has test unit connecting elements for connection to the test unit, and master frame connecting elements for connection to the master frame,
wherein the master frame connecting elements are arranged radially outside the test unit connecting elements.

14. A connection unit for connecting two test units, comprising:
the plate-shaped connection system according to claim 1, and
the interface unit which is fixed to the insert frame.

15. The connection unit according to claim 14, wherein the test board is provided with one or more sockets.

16. A connection unit for connecting two test units, comprising:
the plate-shaped connection system according to claim 4, and
the interface unit which is fixed to the insert frame.

17. The connection unit according to claim 16, wherein the test board is provided with one or more sockets.

18. A test system with two test units, comprising the plate-shaped connection system according to claim 1, and the interface unit which is fixed to the insert frame.

19. A test system with two test units, comprising the plate-shaped connection system according to claim 3, and the interface unit which is fixed to the insert frame.

20. A test system with two test units, comprising the plate-shaped connection system according to claim 4, and the interface unit which is fixed to the insert frame.

* * * * *